(12) United States Patent
Lin et al.

(10) Patent No.: US 10,565,136 B2
(45) Date of Patent: Feb. 18, 2020

(54) CONTROL SYSTEM AND CONTROL METHOD FOR CONTROLLING MEMORY MODULES

(71) Applicant: Kingston Digital, Inc., Fountain Valley, CA (US)

(72) Inventors: Shin Ping Lin, Taichung (TW); Chi Chih Yu, Hsinchu County (TW); Yung Ching Yang, Taoyuan (TW); Yeh Chun Huang, Taichung (TW)

(73) Assignee: Kingston Digital, Inc., Fountain Valley, CA (US)

( * ) Notice: Subject to any disclaimer, the term of this patent is extended or adjusted under 35 U.S.C. 154(b) by 57 days.

(21) Appl. No.: 15/959,162

(22) Filed: Apr. 20, 2018

(65) Prior Publication Data
US 2018/0307634 A1 Oct. 25, 2018

(30) Foreign Application Priority Data

Apr. 20, 2017 (TW) .............................. 106113279 A (51) Int. Cl.
*G06F 13/16* (2006.01)
*G09G 5/39* (2006.01)
(Continued)

(52) U.S. Cl.
CPC .......... *G06F 13/1689* (2013.01); *G06F 3/147* (2013.01); *G06F 13/1694* (2013.01);
(Continued)

(58) Field of Classification Search
CPC .. G06F 13/1689; G06F 13/1694; G06F 3/147; G11C 5/04
See application file for complete search history.

(56) References Cited

U.S. PATENT DOCUMENTS 7,251,773 B2 * 7/2007 Larson .................. G06F 11/326
 701/301
7,584,006 B2 * 9/2009 Paul ........................ G06F 1/206
 700/299
(Continued)

FOREIGN PATENT DOCUMENTS

CN 10123160 A 7/2008
CN 102609040 A 7/2012
(Continued)

OTHER PUBLICATIONS

Office Action to the corresponding UK Patent Application rendered by the UK Intellectual Property Office dated Nov. 9, 2018, 8 pages.

*Primary Examiner* — Glenn A. Auve
(74) *Attorney, Agent, or Firm* — Skaar Ulbrich Macari, P.A.

(57) ABSTRACT

Embodiments of the present invention relate to a control system and a control method for controlling memory modules. In the embodiments, the control system includes a central processing unit (CPU) and a plurality of memory modules, each of which includes a display unit and a micro control unit (MCU) configured to control the display unit. The CPU and the MCUs are connected through a bus, and the CPU instructs, according to a preset bus address, the MCUs to synchronously control the respective display units.

16 Claims, 6 Drawing Sheets

(51) Int. Cl.
*G11C 7/22* (2006.01)
*G06F 3/147* (2006.01)
*G11C 5/04* (2006.01)

(52) U.S. Cl.
CPC .............. *G09G 5/39* (2013.01); *G11C 7/22* (2013.01); *G09G 2330/026* (2013.01); *G11C 5/04* (2013.01)

(56) References Cited

U.S. PATENT DOCUMENTS

| | | | | |
|---|---|---|---|---|
| 9,723,697 | B1* | 8/2017 | Cheng | ............... H05B 33/0857 |
| 10,001,963 | B2* | 6/2018 | Cheng | ...................... G09G 5/00 |
| 2003/0095447 | A1 | 5/2003 | Dean | |
| 2004/0143716 | A1* | 7/2004 | Hong | ................... G06F 3/0605 |
| | | | | 711/170 |
| 2006/0045168 | A1* | 3/2006 | Socci | ......................... G01K 7/42 |
| | | | | 374/163 |
| 2006/0224808 | A1* | 10/2006 | Depew | .................... G06F 13/24 |
| | | | | 710/267 |
| 2007/0150684 | A1 | 6/2007 | Sakagami | |
| 2007/0285362 | A1* | 12/2007 | Chiu | ...................... G06K 19/07 |
| | | | | 345/87 |
| 2010/0123727 | A1 | 5/2010 | Kwa et al. | |
| 2012/0066423 | A1 | 3/2012 | Choo et al. | |
| 2012/0243559 | A1 | 9/2012 | Pan et al. | |
| 2013/0058175 | A1 | 3/2013 | Lin et al. | |
| 2014/0025851 | A1 | 1/2014 | Decesaris et al. | |
| 2014/0223032 | A1* | 8/2014 | Hsieh | ....................... G11C 5/04 |
| | | | | 710/5 |
| 2016/0274984 | A1* | 9/2016 | Nishio | .................. G06F 11/073 |
| 2017/0222870 | A1* | 8/2017 | Hulquest | ............. H04L 41/0803 |
| 2017/0315937 | A1* | 11/2017 | Waltermann | ........... G09G 5/006 |
| 2017/0343198 | A1* | 11/2017 | Ning | .................. G11C 14/0018 |
| 2018/0046421 | A1* | 2/2018 | Mazurek | ................... G06F 3/14 |
| 2018/0239684 | A1* | 8/2018 | Lim | .................. G06F 11/3044 |

FOREIGN PATENT DOCUMENTS

| | | |
|---|---|---|
| CN | 103902493 A | 7/2014 |
| KR | 1020050011822 A | 1/2005 |
| TW | M252996 U | 12/2004 |
| TW | 201312565 A1 | 3/2013 |
| TW | I576697 B | 4/2017 |

\* cited by examiner

CONTROL SYSTEM AND CONTROL METHOD FOR CONTROLLING MEMORY MODULES

PRIORITY

This application claims priority to Taiwan Patent Application No. 106113279 filed on Apr. 20, 2017, which is hereby incorporated by reference in its entirety.

FIELD

Embodiments of the present invention relate to a control system and control method. More particularly, embodiments of the present invention relate to a control system and control method for controlling memory modules.

BACKGROUND

A memory module comprises a circuit board (e.g. a printed circuit board, PCB) and a memory unit that is set onto the circuit board. The memory module is usually installed into the memory slot of a motherboard of a computing apparatus for data storage. For example, the memory module may be a dynamic random access memory (DRAM) module which is packaged as a single in-line memory module (SIMM), a double in-line memory module (DIMM) or the like. The connectors on either side are connected to each other in the SIMM, but this is not the case with the DIMM. Compared to the SIMM with a 32 bit bus, the DIMM with a 64 bit bus allows twice the data to pass through.

To ensure the efficiency and stability of the memory module, several kinds of detection devices (which may be configured inside or outside the memory module) are known to detect various kinds of parameters (e.g. temperature, transmission rate etc.). Also, various kinds of display units (e.g. LED displays) are added into the memory module to provide users with detected information. In addition to the memory unit and the display unit, a micro control unit (MCU) configured to control the display unit is generally added into the memory module. The MCUs of all memory modules that have respective bus addresses for identification by a central processing unit (CPU) installed into a motherboard may be electrically connected to the CPU through the same bus of the motherboard (e.g. a system management bus). The CPU may transmit instructions to the MCUs of the memory modules according to their bus addresses respectively so that each memory module can control its display unit by its MCU based on the corresponding instruction from the CPU.

When the CPU wants to instruct several MCUs to control the respective display units in the memory modules, it cannot transmit commands to the MCUs synchronously (i.e., at the same time) because the MCUs have different bus addresses. The display units cannot work synchronously either because of the time difference of transmitting the commands. In addition, since the CPU cannot transmit the commands to the MCUs at the same time, it will take more time to instruct all of the MCUs to control the display units, especially as the number of the memory modules increases. Accordingly, an urgent objective in the art is to overcome the limitation in that the CPU cannot synchronously instruct the MCUs and the MCUs cannot synchronously control the display units.

SUMMARY

To achieve the aforesaid objective, the present disclosure includes a control system for controlling memory modules. The control system may comprise a plurality of memory modules and a central processing unit. Each of the memory modules may comprise a memory unit, a display unit and a micro control unit configured to control the display unit. The central processing unit may be connected to the micro control units through a bus. The central processing unit may be configured to instruct the micro control units to initialize the display units, and configured to transmit a control signal to the micro control units according to a preset bus address to instruct the micro control units to synchronously control the display units after the initialization of the display units is completed. Each of the micro control units may comprise a bus address that is the same as the preset bus address.

To achieve the aforesaid objective, the disclosure also includes a control method for controlling memory modules. Each of the memory modules may comprise a memory unit, a display unit and a micro control unit configured to control the display unit. The micro control units may be connected to a central processing unit through a bus. The control method may comprise the following: instructing the micro control units by the central processing unit to initialize the display units; transmitting a control signal from the central processing unit to the micro control units according to a preset bus address after the initialization of the display units is completed; and based on the control signal, synchronously controlling the display units by the micro control units. Each of the micro control units may comprise a bus address that is the same as the preset bus address.

As described above, each of the micro control units may comprise a bus address that is the same as the preset bus address so that the central processing unit may synchronously transmit signals/commands to all of the micro control units, and thus, the micro control units are able to synchronously control the display units. In other words, in the embodiments of the present invention, the display units can work synchronously. Furthermore, in the embodiments of the present invention, it may always take the same time to instruct all micro control units to control the display units regardless of the number of the memory modules. Accordingly, the embodiments of the present invention can achieve the aforesaid objective.

The summary of the invention summarizes the core concepts and encompasses the problems to be solved, the means to be adopted and the effects that can be achieved by the present invention to provide a basic understanding of the present invention by a person having ordinary skill in the art. However, it shall be understood that this Summary section is not intended to cover all embodiments of the present invention, but to present the core concepts of the present invention in a simplified form as an introduction to the following detailed description.

DETAILED DESCRIPTION

Embodiments described hereinafter are not intended to limit the present invention to any specific environments, applications, structures, process flows or steps described in these embodiments. In the attached drawings, elements unrelated to the present invention are omitted from depiction; and dimensions of individual elements and dimensional relationships among the individual elements in the attached drawings are illustrated only as exemplary examples, but not to limit the present invention. Unless otherwise stated, the same or similar symbols correspond to the same or similar elements in the following description.

Figure 1:
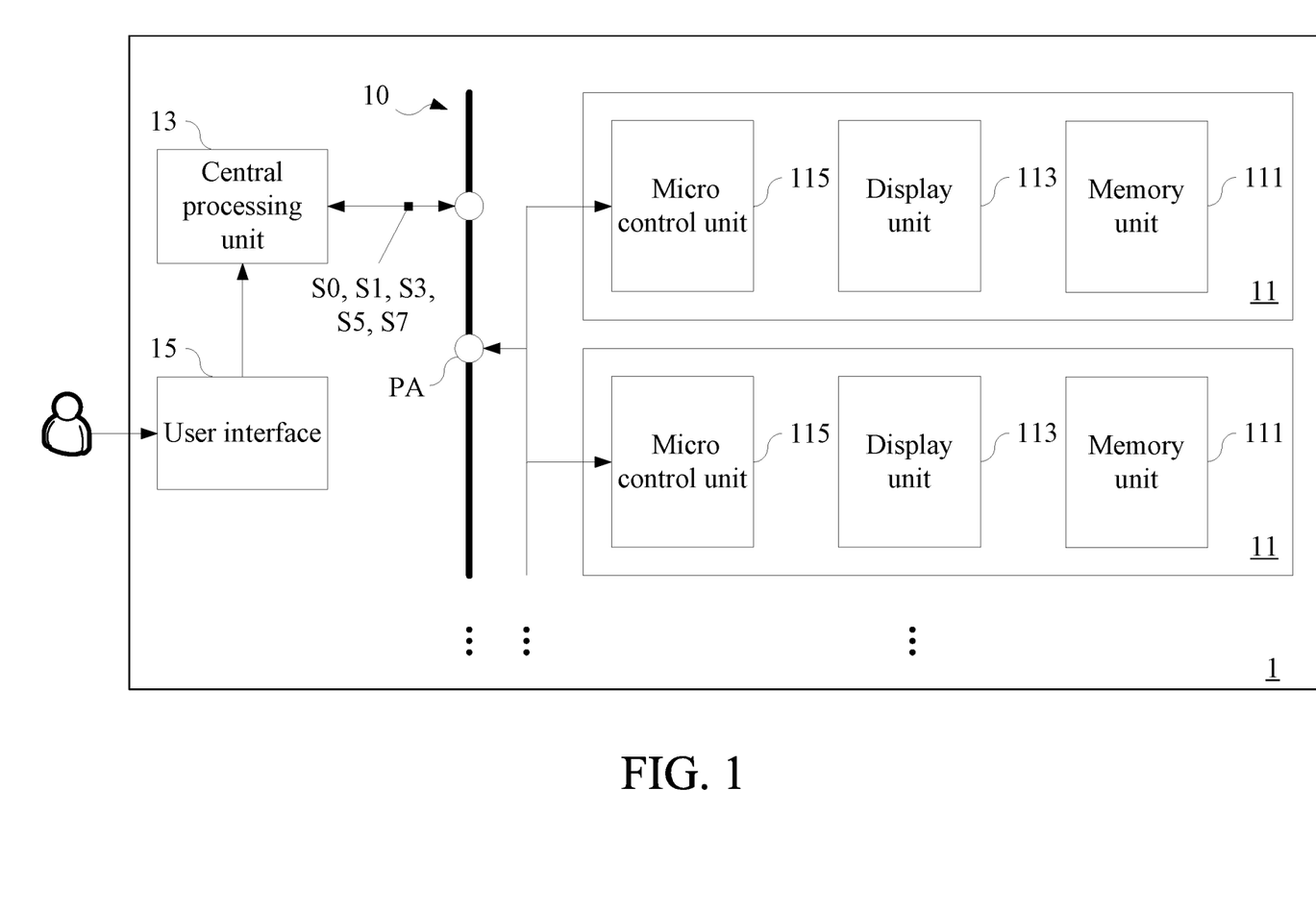
FIG. 1 illustrates an architecture of a control system for controlling memory modules by way of example according to one or more embodiments of the present invention.

FIG. 1 illustrates an architecture of a control system for controlling memory modules by way of example according to one or more embodiments of the present invention. However, what is shown in FIG. 1 is only intended to illustrate the embodiments of the present invention but not to limit the present invention.

With reference to FIG. 1, the control system 1 may comprise a plurality of memory modules 11 and a central processing unit 13. For example, the control system 1 may be applied to the motherboards of various kinds of computing apparatuses (for example, desktops, laptops, tablets, smartphones and the like), and the memory modules 11 and the central processing unit 13 may be installed into the memory slots and the central processing unit slot of the motherboard respectively.

The memory modules 11 are preferred to be one of various types of volatile memory modules such as a Dynamic Random Access Memory (DRAM) or a Static Random-Access Memory (SRAM). In some embodiments, the memory modules 11 may be one of various types of non-volatile memory modules. Each of the memory modules 11 may comprise a memory unit 111, a display unit 113 and a micro control unit 115 configured to control the display unit 113. In each of the memory modules 11, the connection between the memory unit 111, the display unit 113 and the micro control unit 115 may be connected directly (i.e., connecting to each other not via other elements of specific functions) or indirectly (i.e., connecting to each other via other elements of specific functions).

In each of the memory modules 11, the memory unit 111 may comprise one or more memory integrated circuits whose types depend on the type of the memory module 11. For example, if a memory module 11 is a DRAM module, the memory unit 111 may comprise one or more DRAMs, while if a memory module 11 is an SRAM module, the memory unit 111 may comprise one or more SRAMs. In some embodiments, if a memory module 11 is a non-volatile memory module, the memory unit 111 may comprise one or more non-volatile memories.

In each of the memory modules 11, the display unit 113 may be one of various kinds of displaying apparatuses or integrated circuits. The display unit 113 is preferred to be one of various kinds of light-emitting diode (LED) displaying apparatuses or integrated circuits. The LED displaying apparatus or integrated circuits may comprise one or more LEDs with the same color or different colors. In some embodiments, the display unit 113 may be, for example, a liquid crystal displaying apparatus or integrated circuit, or other displays.

In each of the memory modules 11, the micro control unit 115 may be one of various kinds of microprocessors or microcontrollers capable of processing signals. A microprocessor or microcontroller is a programmable specific integrated circuit which is capable of operating, storing, outputting/inputting or the like and may receive and process various kinds of coded instructions, thereby, performing various kinds of logic operations and arithmetic operations and outputting corresponding operational results. In each of the memory modules 11, the micro control unit 115 may be configured to control the display unit 113 so that the display unit 113 displays the required information. In the case where the central processing unit 13 has never instructed the micro control unit 115, the micro control unit 115 may control the display unit 113 by itself. In the case where the central processing unit 13 has instructed the micro control unit 115, the micro control unit 115 may passively control the display unit 113 according to the instructions of the central processing unit 13.

Likewise, the central processing unit 13 may be one of various kinds of microprocessors or microcontrollers. However, the central processing unit 13 is responsible for all of the operations of the control system 1 including instructing the micro control unit 115 to control the display unit 113 for various needs. Specifically, the central processing unit 13 may be connected to all of the micro control units 115 through a bus 10 and may transmit various kinds of control commands/signals/parameters to the micro control units 115 though the bus 10 so that the micro control unit 115 may control the display unit 113 according to the received commands/signals/parameters.

The bus 10 may be a communication interface between the central processing unit 13 and the micro control units 115 for data transmission and logic controlling. The central processing unit 13 has its own bus address and each of the micro control units 115 has its own bus address too. Unlike the prior art, the bus addresses of all of the micro control units 115 are the same as a preset bus address PA. For example, before the central processing unit 13 controls the memory modules 11, it may configure the bus addresses of all of the micro control units 115 with the preset bus address PA via the bus 10. The bus 10 may be configured under various kinds of bus specifications. The bus 10 is preferably configured according to a System Management Bus (SMBus) specification. In some embodiments, the bus 10 may be configured according to any other bus specification, such as an Inter-Integrated Circuit (I2C) specification.

In some embodiments, in addition to the central processing unit 13 and the memory modules 11, the control system 1 may further comprise a user interface 15. The user interface 15 may comprise various kinds of input/output elements such as a keyboard, a mouse, a touch panel, and the like. The user interface 15 may also comprise a software system to provide a user-friendly and visualized platform so that the user can communicate easily with the central processing unit 13 to send commands to the central processing unit 13 and receive the feedback information from the central processing unit 13.

Figure 2:
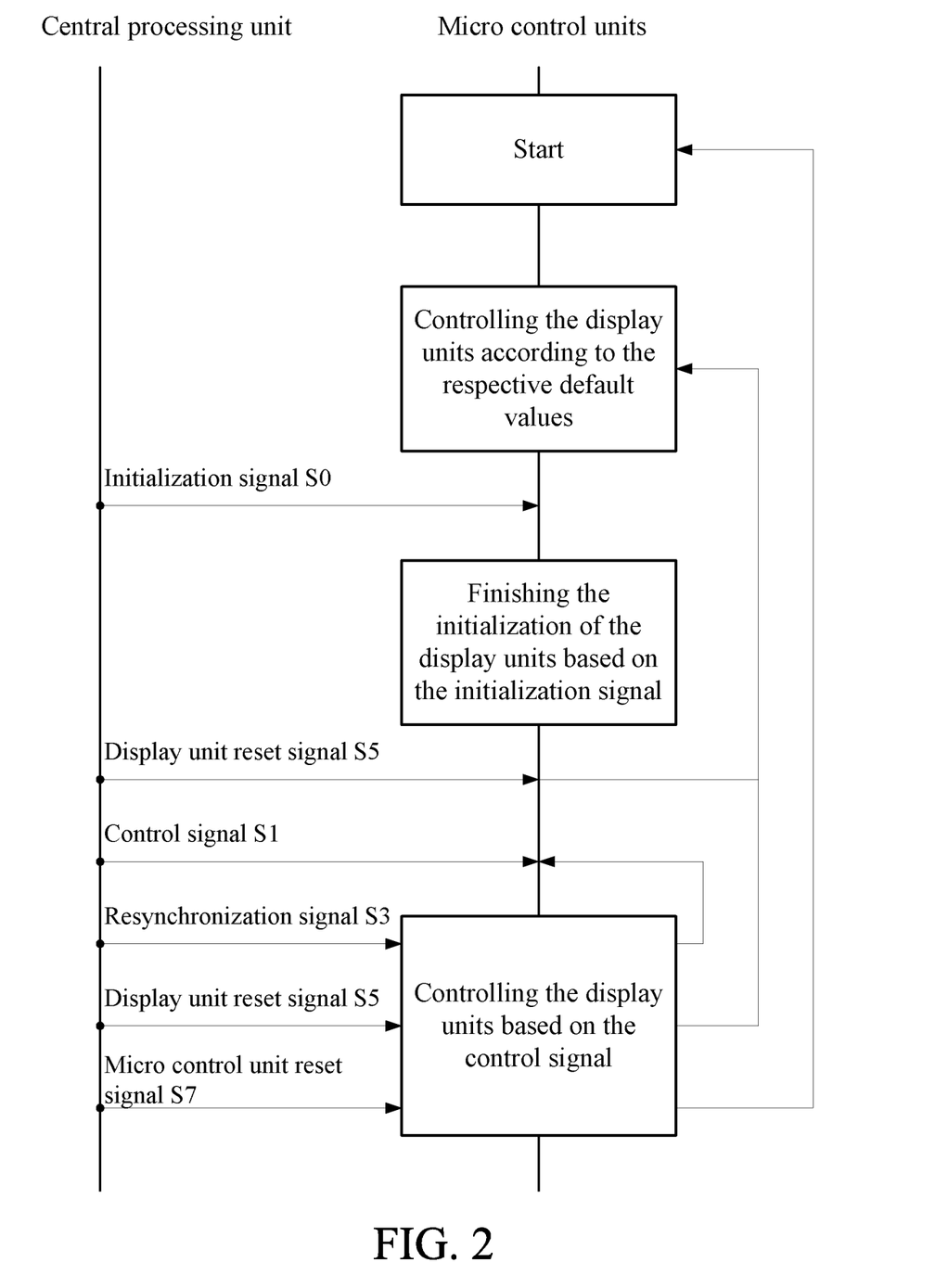
FIG. 2 illustrates an operation mode of the control system shown in FIG. 1 by way of example according to one or more embodiments of the present invention.

FIG. 2 illustrates an operation mode of the control system 1 shown in FIG. 1 by way of example according to one or more embodiments of the present invention. However, what is shown in FIG. 2 is only intended to illustrate the embodiments of the present invention but not to limit the present invention.

With reference to FIGS. 1-2, the micro control unit 115 of every memory module 11 may start controlling the display unit 113 of the same memory module 11 according to a default value within a period of time (e.g. one second, five seconds, ten seconds, or fifteen seconds, etc.) from the time where the micro control unit 115 was just powered up. Each of the default values may comprise various parameters of controlling the corresponding display unit 113 which the corresponding micro control unit 115 requires on its own initiative (i.e., in the absence of the instructions of the central processing unit 13). The parameters may comprise, for example, red brightness, green brightness, blue brightness, display mode (such as marquee, flashing, etc.), and display speed, etc. The micro control units 115 of the control system 1 may have the same preferable default value; however, the micro control units 115 may still have different default values in some embodiments. In some embodiments, the micro control units 115 may be activated by itself as the power supply of the control system 1 turns on. In some embodiments, the micro control units 115 may not be activated as the power supply of the control system 1 turns on unless it further receives a starting signal from the central processing unit 13.

In some embodiments, while the micro control units 115 are controlling the display units 113 according to the respective default values, the central processing unit may synchronously transmit an initialization signal S0 to all of the micro control units 115 according to the preset bus address PA to instruct the micro control units 115 to synchronously initialize the display units 113. The initialization is performed for the sake of enabling the micro control units 115 to control the display units 113 passively (i.e., to control the display units 113 based on the instructions of the central processing unit 13). The initialization may comprise setting parameters necessary for controlling the display units 113 to the micro control units 115. The parameters may comprise, for example, red brightness, green brightness, blue brightness, and display speed, etc.

In some embodiments, the central processing unit may also transmit serval initialization signals to the micro control units 115 respectively according to the respective bus address of the micro control units 115. In this case, the micro control units 115 may initialize the display units 113 according to the received initialization signals respectively.

In some embodiments, after the initialization of the display units 113 is completed according to either the same initialization signal S0 or the respective initialization signals, the central processing unit 13 may synchronously transmit a control signal S1 to the micro control units 115 according to the preset bus address PA. Then, the micro control units 115 may synchronously control the respective display units 113 based on the control signal S1. For example, the control signal S1 may comprise various commands of assigning a display mode so that the display units 113 may synchronously display their contents according to the assigned display mode. The assigned display mode may be, for example, marquee, flashing, or others.

In some embodiments, while the micro control units 115 are initializing the display units 113 according to either the same initialization signal S0 or the respective initialization signals, the central processing unit 13 may synchronously transmit a display unit reset signal S5 to the micro control unit 115 according to the preset bus address PA. In some embodiments, after the initialization of the display units 113 is completed according to either the same initialization signal S0 or the respective initialization signals and before the central processing unit 13 transmits the control signal S1, the central processing unit 13 may also synchronously transmit the display unit reset signal S5 to the micro control unit 115 according to the preset bus address PA. Based on the display unit reset signal S5, the micro control units 115 may synchronously restart the control of the respective display units 113 according to the respective default values.

In some embodiments, while the micro control units 115 are controlling the display units 113 based on the control signal S1, the display states of some display units 113 may become asynchronous because of various situations such as a change in temperature or difference in reaction time between display elements. Under those situations, the central processing unit 13 may simultaneously transmit a resynchronization signal S3 to the micro control units 115 according to the preset bus address PA during the micro control unit 115 controlling the display units 113 based on the control signal S1. Then, according to the instructions of the resynchronization signal S3, the micro control units 115 may synchronously restart the control of the respective display units 113 based on the control signal S1. The central processing unit 13 may transmit the resynchronization signal S3 to the micro control units 115 at any time during the micro control unit 115 controlling the display units 113 based on the control signal S1.

In some embodiments, while the micro control unit 115 is controlling the display units 113 based on the control signal S1, the central processing unit 13 may simultaneously transmit a micro control unit reset signal S7 to the micro control units 115 at any time according to the preset bus address PA to simultaneously reset the micro control units 115.

In some embodiments, while the micro control unit 115 is controlling the display units 113 based on the control signal S1, the central processing unit 13 may transmit a display unit reset signal S5 to the micro control units 115 simultaneously at any time according to the preset bus address PA. Then, according to the instructions of the display unit reset signal S5, the micro control units 115 may synchronously restart the control of the respective display units 113 according to the respective default values.

Figure 3:
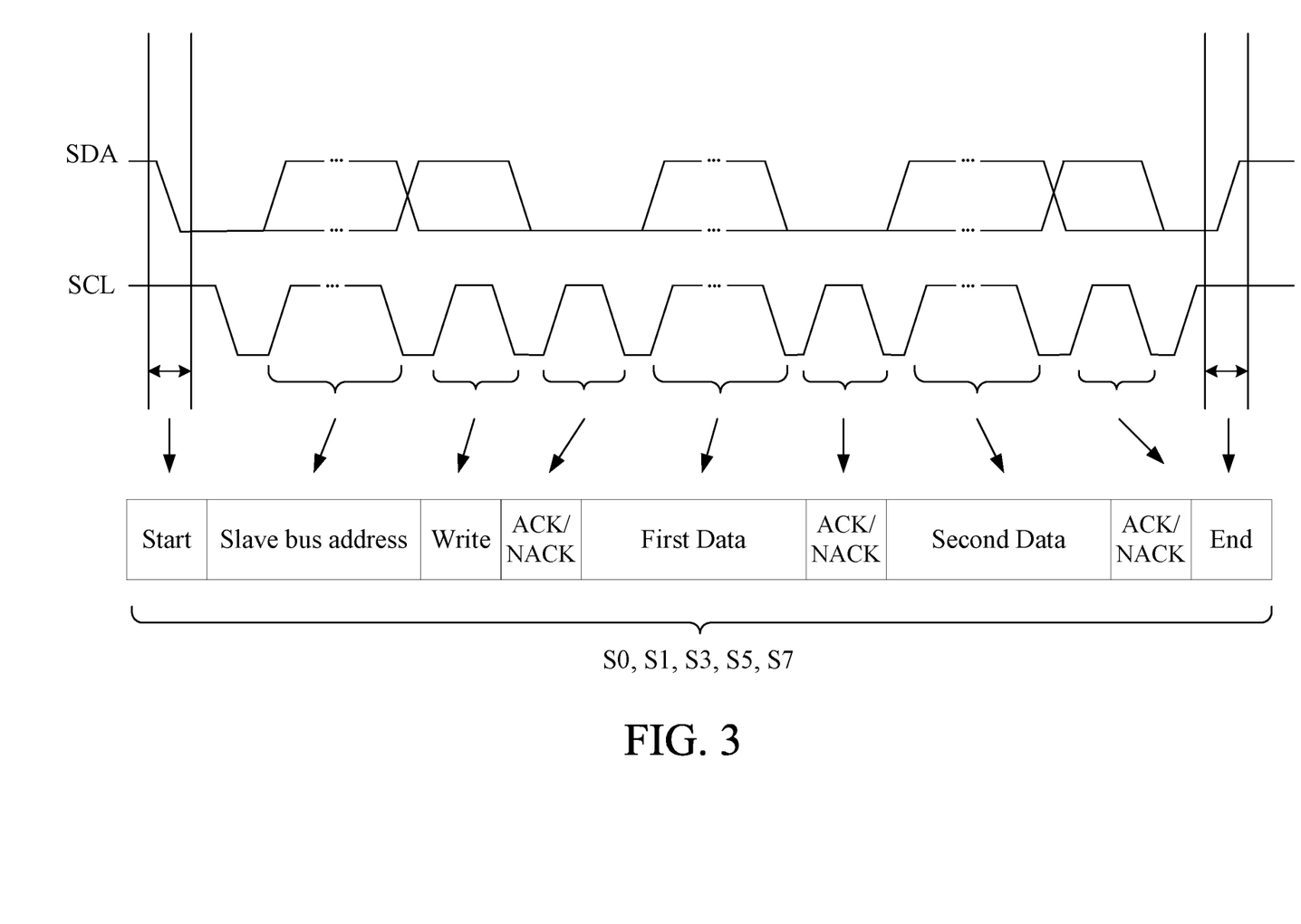
FIG. 3 illustrates an architecture of the signals transmitted from a central processing unit to micro control units by way of example according to one or more embodiments of the present invention.

FIG. 3 illustrates an architecture of the signals transmitted from the central processing unit 13 to the micro control units 115 by way of example according to one or more embodiments of the present invention. However, what is shown in FIG. 3 is only intended to illustrate the embodiments of the present invention but not to limit the present invention.

With reference to FIG. 3, the bus 10 of the control system 1 may be a SMBus for example. As the central processing unit 13 communicates with the micro control units 115 through the SMBus, the central processing unit 13 may be defined as a master device and every micro control unit 115 may be defined as a slave device so that the central processing unit 13 may transmit various kinds of signals (e.g. the initialization signal S0, the control signal S1, the resynchronization signal S3, the display unit reset signal S5, and the micro control unit reset signal S7, etc.) via the bus 10 to the micro control units 115. The micro control units 115 may then control the respective display units 113 according to the signals.

With reference to FIG. 3 again, every signal transmitted from the central processing unit 13 may comprise one or more commands, and every command may comprise a slave bus address, a first data, and a second data. The slave bus address may indicate which one of the micro control units 115 connected to the bus 10 should receive the command. The first data may indicate the register address of the indicated micro control unit 115, while the second data may indicate the parameter(s) to be stored into the register address. To enable the micro control units 115 to synchronously control the respective display units 113, the slave bus address in every command transmitted from the central processing unit 13 may be set to be the same as the preset bus address PA, thereby transmitting various kinds of commands to the micro control units 115 simultaneously.

As shown as FIG. 3, the SMBus may comprise two data lines, the serial data line SDA and the serial clock line SCL. The serial clock line SCL is configured to decide the signal clock, and the serial data line SDA is configured to decide the signal output. Any command starts as the falling edge of the serial data line SDA occurs at the high level of the serial clock line SCL. The command finishes as the rising edge of the serial data line SDA occurs at the high level of the serial clock line SCL. In each of the commands, the central processing unit 13 may transmit a slave bus address (for example, represented by seven bits) first, and then transmit a write request (for example, represented by one bit). Next, the central processing unit 13 may wait for an acknowledgement ACK/negative-acknowledgement NACK from the micro control units 115. When the central processing unit 13 receives the acknowledgement ACK from a micro control unit 115, the central processing unit 13 may transmit the first data (for example, represented by eight bits) and then wait for another acknowledgement ACK/negative-acknowledgement NACK from the micro control unit 115 again. When the central processing unit 13 receives the acknowledgement ACK from the micro control unit 115 again, the central processing unit 13 may transmit the second data (for example, represented by eight bits) and then wait for yet another acknowledgement ACK/negative-acknowledgement NACK from the micro control unit 115.

In some embodiments, if the bus 10 is an SMBus, the initialization signal S0 may comprise various kinds of initialization commands as shown in Table 1 where the slave bus address, the first data, and the second data are all represented in a hexadecimal format.

TABLE 1

| Initialization command | Slave bus address | First data | Second data |
|---|---|---|---|
| Setting of red brightness | 0x27 | 0xA1 | 0x00~0xFF |
| Setting of green brightness | 0x27 | 0xA2 | 0x00~0xFF |
| Setting of blue brightness | 0x27 | 0xA3 | 0x00~0xFF |
| Setting of display speed | 0x27 | 0xA4 | 0x00~0xFF |
| Setting of bus address | 0x27 | 0xA5 | 0x00~0xFF |
| Finishing of initialization | 0x27 | 0xAF | 0x0f |

In Table 1, the slave bus address of every initialization command may be set to be the same as the preset bus address PA. For example, in the case where the bus addresses of all of the micro control units 115 are the preset bus address PA (e.g., "0x27") and the slave bus address of every initialization command of Table 1 is the preset bus address PA (e.g., "0x27") too, the central processing unit 13 may simultaneously transmit any of the commands to the micro control units 115 via the bus 10.

In Table 1, the first data and the second data may be defined by the designer for different requirements. In some embodiments, the first one from the right ranges from "0x0" to "0xF" of every first data in Table 1 and may be used to define the initialization item of the current initialization command, while the corresponding second data ranging from "0x00" to "0xFF" may be used to define the detailed parameters for the initialization item. For example, if the value of the first one from the right of the first data is "0x1,"  then the initialization item may be "setting of red brightness." Similarly, if the values of the first one from the right of the first data is "0x2," "0x3," and "0x4", then the initialization item may be "setting of green brightness", "setting of blue brightness", and "setting of display speed," respectively. If the value of the first one from the right of the first data is "0x5," the initialization item may also be "setting of bus address" for controlling/altering the bus addresses of the micro control units 115, and the new bus addresses may be defined by the values of the second data, in some embodiments.

With reference to Table 1 again, the second one from the right ranging from "0x0" to "0xF" of every first data may be used to define which one or ones of the micro control units 115 need to perform the initialization item as defined by the first one from the right of the first data of the current command. In some embodiments, it is useful to assign a specific value ("0xA" for example) representative of all of the micro control units 115 to the second one from the right of the first data. In other words, if the value of the second one from the right of the first data of an initialization command is "0xA", all of the micro control units 115 receiving the initialization command need to perform the initialization item thereof.

In some embodiments, it is also practical to assign different values representative of different micro control units 115 to the second one from the right of the first data. For example, if the value of the second one from the right of the first data of an initialization command is "0x1", "0x2", or "0xF", only the corresponding micro control unit 115 needs to perform the initialization item of the initialization command.

The order of the initialization commands shown in Table 1 may be changed for different needs; however, the central processing unit 13 should always transmit the command of the finishing initialization to the micro control units 115 via the bus 10 to inform the micro control units 115 of finishing their initialization. As shown in Table 1, for example, the command of finishing the initialization may be defined with the first one from the right of the first data being "0xF" and the second data being "0x0F". There may be some time between any two initialization commands (e.g. 10 milliseconds, 15 milliseconds, or 100 milliseconds for example).

In some embodiments, if the bus 10 is an SMBus, the control signal S1 may comprise several mode controlling commands as shown in Table 2 where the slave bus address, the first data, and the second data are all represented in a hexadecimal format.

TABLE 2

| mode controlling command | Slave bus address | First data | Second data |
|---|---|---|---|
| Setting of continuous light mode | 0x27 | 0xAA | 0x02 |
| Setting of breathing light mode | 0x27 | 0xAA | 0x03 |
| Setting of flashing light mode | 0x27 | 0xAA | 0x04 |
| Setting of three-color light cycle mode | 0x27 | 0xAA | 0x07 |
| Setting of double flashing light mode | 0x27 | 0xAA | 0x08 |

In Table 2, the slave bus address of every mode controlling command may be set to be the same as the preset bus address PA (e.g. "0x27") so that the central processing unit 13 may simultaneously transmit any of the mode controlling commands to the micro control units 115 via the bus 10, and thus the micro control units 115 may simultaneously control the display modes of the respective display units 113.

In Table 2, the first data and the second data may also be defined by the designer for different requirements. In some embodiments, for example, every mode controlling command of Table 2 may be defined with the first one from the right of the first data being "0xA", while the corresponding second data ranging from "0x00" to "0xFF" may be used to define the detailed parameters for the display mode defined in the mode controlling command. For example, if the value of the second data is "0x02," "0x03," "0x04," "0x07," or "0x08," the display mode defined in the mode controlling command may be "continuous light mode", "breathing light mode", "flashing light mode", "three-color light cycle mode", or "double flashing light mode," respectively. Furthermore, the specific value ("0xA" for example) representative of all of the micro control units 115 may also be assigned to the second one from the right of the first data of any of the mode controlling commands of Table 2 so that all of the micro control units 115 can simultaneously control the display modes of the respective display units 113 according to the display mode defined in the received mode controlling command.

In some embodiments, if the bus 10 is an SMBus, the resynchronization signal S3 may comprise the resynchronization command as shown in Table 3 where the slave bus address, the first data, and the second data are all represented in a hexadecimal format.

TABLE 3

|  | Slave bus address | First data | Second data |
|---|---|---|---|
| Resynchronization command | 0x27 | 0xAA | 0x06 |

In Table 3, the slave bus address may be set to be the same as the preset bus address PA (e.g. "0x27") so that the central processing unit 13 may simultaneously transmit the resynchronization command to the micro control units 115 via the bus 10 to instruct the micro control units 115 to simultaneously restart the control of the respective display units 113 based on the control signal S1. For example, in response to the resynchronization command, the micro control units 115 may simultaneously return to the situations where their initialization was just finished, and then simultaneously restart the control of the respective display units 113 within a period of time (e.g. 50 milliseconds, 500 milliseconds, or 1 second). In Table 3, the first data and the second data may also be defined by the designer for different requirements. In some embodiments, for example, the resynchronization command of Table 3 may be defined with the first one from the right of the first data being "0xA" and the second data being "0x06". Furthermore, the specific value ("0xA" for example) representative of all of the micro control units 115 may also be assigned to the second one from the right of the first data of the resynchronization command of Table 3 so that all of the micro control units 115 can simultaneously return to the situations where their initialization was just finished, and then simultaneously restart the control of the respective display units 113 according to the display mode instructed by the control signal S1, thereby synchronizing the display modes of the display units 113 again.

In some embodiments, if the bus 10 is an SMBus, the display unit reset signal S5 may comprise the display unit reset command as shown in Table 4 where the slave bus address, the first data, and the second data are all represented in a hexadecimal format.

TABLE 4

|  | Slave bus address | First data | Second data |
|---|---|---|---|
| Display unit reset command | 0x27 | 0xAA | 0x87 |

In Table 4, the slave bus address may be set to be the same as the preset bus address PA (e.g. "0x27") so that the central processing unit 13 may simultaneously transmit the display unit reset command to the micro control units 115 via the bus 10 to instruct the micro control units 115 to simultaneously restart the control of the respective display units 113 according to the respective default values.

In Table 4, the first data and the second data may also be defined by the designer for different requirements. In some embodiments, for example, the display unit reset command of Table 4 may be defined with the first one from the right of the first data being "0xA" and the second data being "0x87". Furthermore, the specific value ("0xA" for example) representative of all of the micro control units 115 may also be assigned to the second one from the right of the first data of the resynchronization command of Table 4 so that all of the micro control units 115 can restart the control of the respective display units 113 according to the respective default values.

In some embodiments, if the bus 10 is an SMBus, the micro control unit reset signal S7 may comprise the micro control unit reset command as shown in Table 5 where the slave bus address, the first data, and the second data are all represented in a hexadecimal format.

TABLE 5

|  | Slave bus address | First data | Second data |
|---|---|---|---|
| Micro control unit reset command | 0x27 | 0xAA | 0x88 |

In Table 5, the slave bus address may be set to be the same as the preset bus address PA (e.g. "0x27") so that the central processing unit 13 may simultaneously transmit the micro control unit reset command to the micro control unit 115 via the bus 10 to simultaneously reset the micro control units 115.

In Table 5, the first data and the second data may also be defined by the designer for different requirements. In some embodiments, for example, the micro control unit reset command of Table 5 may be defined with the first one from the right of the first data being "0xA" and the second data being "0x88". Furthermore, the specific value ("0xA" for example) representative of all of the micro control units 115 may also be assigned to the second one from the right of the first data of the resynchronization command of Table 5 to simultaneously reset the micro control units 115.

Figure 4:
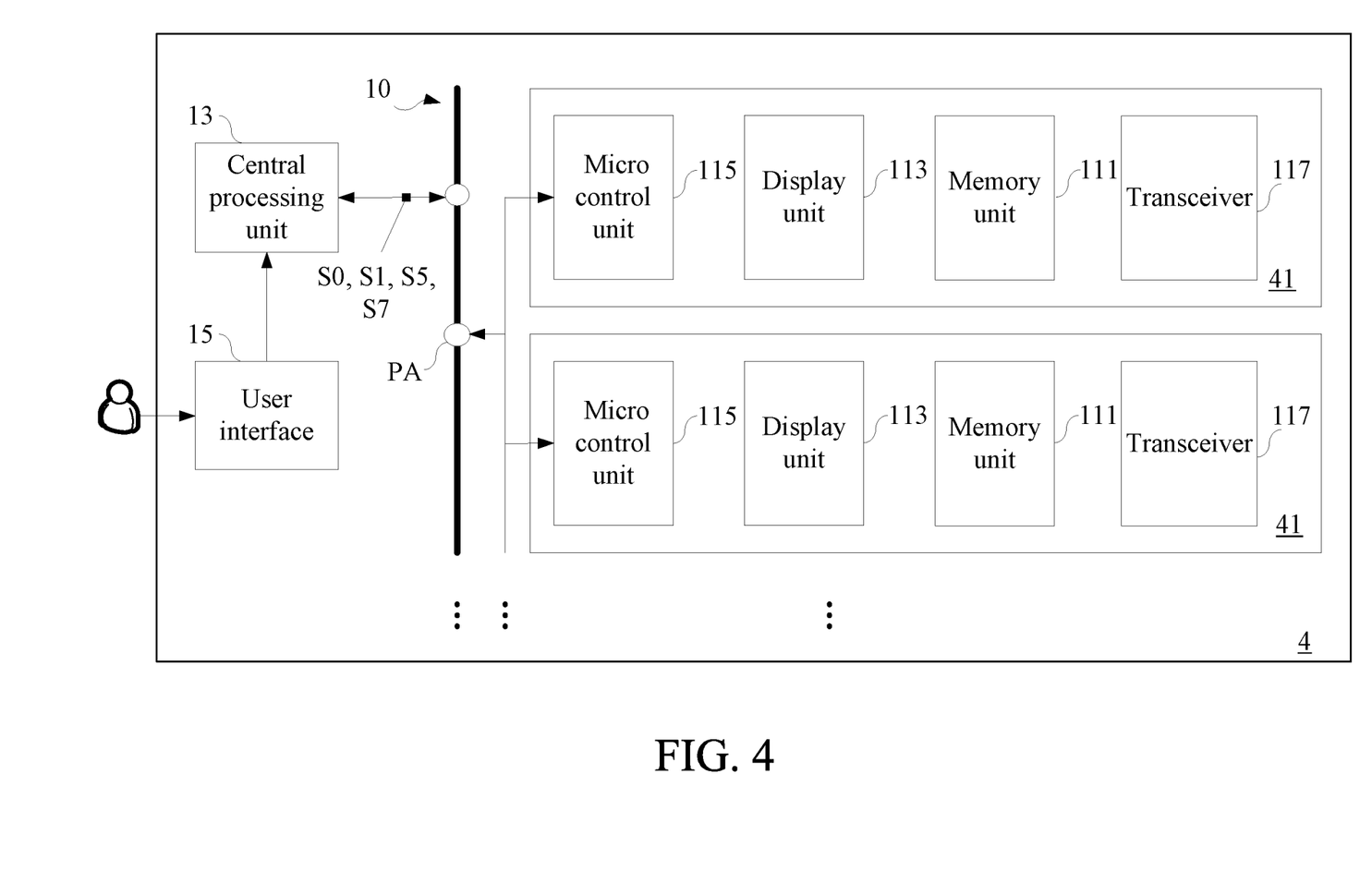
FIG. 4 illustrates an architecture of another control system for controlling memory modules by way of example according to one or more embodiments of the present invention.

FIG. 4 illustrates an architecture of another control system 4 for controlling the memory modules according to one or more embodiments of the present invention. However, what is shown in FIG. 4 is only intended to illustrate the embodiments of the present invention but not to limit the present invention.

With reference to FIG. 1 and FIG. 4, the difference between the control system 1 and the control system 4 is that each memory module 41 of the control system 4 may further comprise a transceiver 117 in addition to the memory unit 111, the display unit 113 and the micro control unit 115. Each transceiver 117 may comprise a transmitter and a receiver to transmit and receive various kinds of optical signals such as an infrared light, laser light and so on, or to transmit and receive various kinds of electronic signals in a wired or a wireless way. Moreover, the control system 4 enables the memory modules 41 to simultaneously restart the control of their respective display unit 113 based on the control signal S1 without the resynchronization signal S3. For example, as the central processing unit 13 fails to transmit the resynchronization signal S3, or the micro control units 115 cannot receive the resynchronization signal S3, the memory modules 41 can still simultaneously restart the control of their respective display unit 113 based on the control signal S1, thereby synchronizing the display states of the display units 113 again.

While the micro control units 115 are controlling the display units 113 based on the control signal S1, the micro control unit 115 of one of the memory modules 41 may, on its own, restart the control of the display unit 113 of the same memory module 41 and generate an automatic synchronization signal. Then, the automatic synchronization signal may be transmitted to the other micro control units 115 by the transceivers 117 of the memory modules 41 to instruct the other micro control units 115 to restart the control of the respective display units 113 based on the control signal S1.

Figure 5:
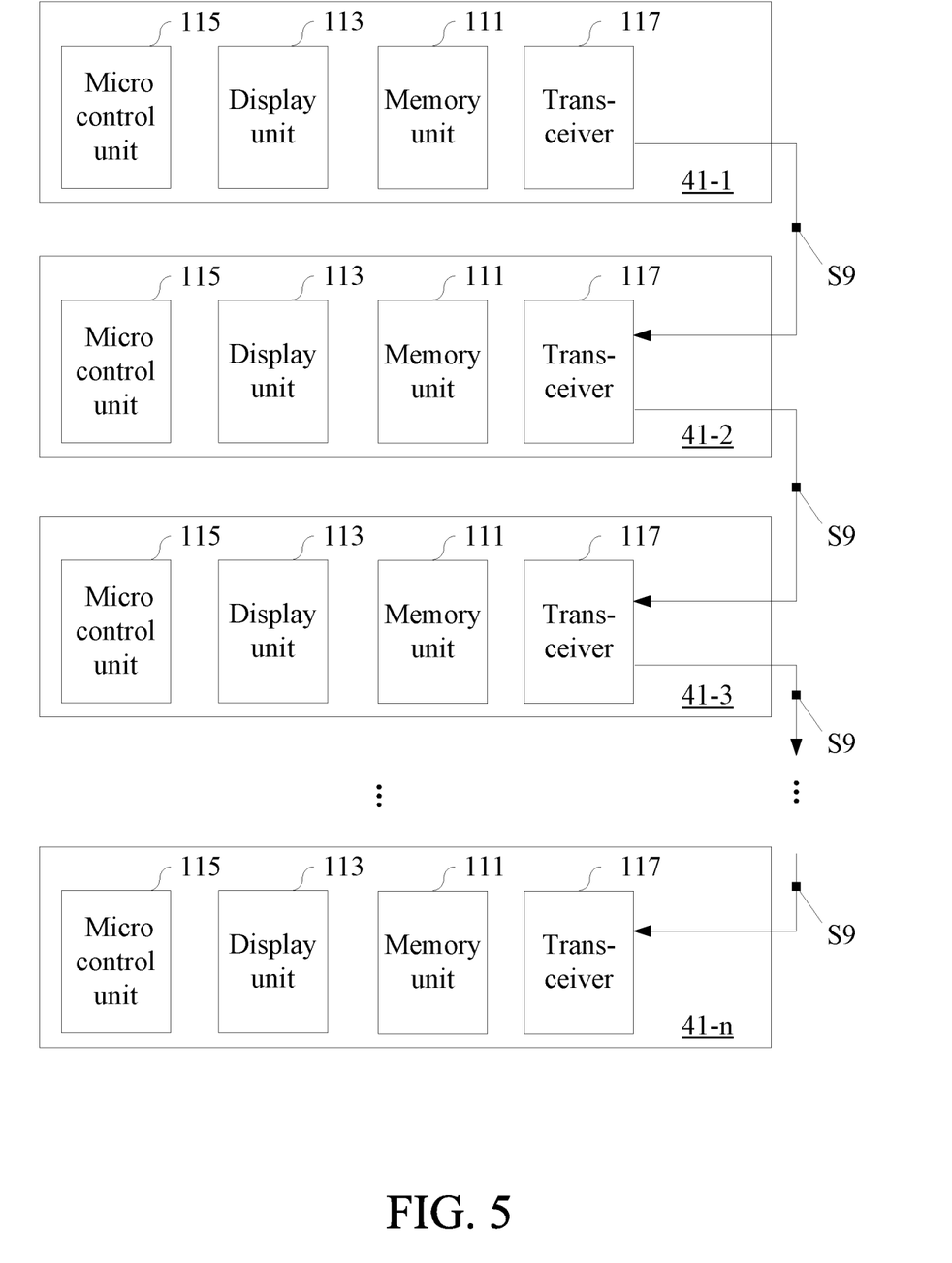
FIG. 5 illustrates how to transmit an automatic synchronization signal among the memory modules shown in FIG. 4 by way of example according to one or more embodiments of the present invention.

FIG. 5 illustrates how to transmit the automatic synchronization signal among the memory modules 41 shown in FIG. 4 by way of example according to one or more embodiments of the present invention. However, what is shown in FIG. 5 is only intended to illustrate the embodiments of the present invention but not to limit the present invention.

With reference to FIG. 5, while the micro control units 115 is controlling the display units 117 based on the control signal S1, the micro control unit 115 of one of the memory modules 41 (e.g. the memory module 41-1) may, on its own, restart the control of the display unit 113 of the same memory module 41-1 based on the control signal S1 and generate an automatic synchronization signal S9. For instance, the control system 4 may be configured so that the memory module 41-1 may restart the control of the display unit 113 of the same memory module 41-1 based on the control signal S1 and generate the automatic synchronization signal S9 within a period of time (e.g. two seconds, five seconds, or ten seconds) from the time where the memory module 41-1 just started controlling the display unit 113 of the same memory module 41-1 based on the control signal S1. In some embodiments, the memory module 41-1 generating the automatic synchronization signal S9 may be determined in advance through various kinds of software and/or hardware settings. For example, the memory module 41 installed into the first memory module slot may be appointed as the role of generating the automatic synchronization signal S9.

The automatic synchronization signal S9 may be transmitted to the other micro control units 115 through the transceivers 117 of the memory modules 41 in a sequential way or at the same time. For example, the automatic synchronization signal S9 may be transmitted from the transceiver 117 of the memory module 41-1 to the transceiver 117 of the next memory module 41-2, and then be transmitted from the transceiver 117 of the memory module 41-2 to the transceiver 117 of the next memory module 41-3 and so on, until it is transmitted to the transceiver 117 of the last memory module 41-n, wherein n is the number of the memory modules 41. The sequence of transmitting the automatic synchronization signal S9 among the memory modules 41 may be altered for different requirements. Another example is that the automatic synchronization signal S9 may be transmitted from the transceiver 117 of the memory module 41-1 to the ones of the other memory modules 41 (i.e., the memory modules 41-2 to 41-n) at the same time. Either way, when one transceiver 117 receives the automatic synchronization signal S9, the corresponding micro control unit 115 will restart the control of the display unit 113 of the same memory module 41 based on the control signal S1.

In some embodiments, the control system 4 may also work even if the central processing unit 13 is capable of transmitting the resynchronization signal S3. In such a case, the control system 4 may enable its memory modules 41 to restart the control of the respective display units 113 thereof based on the control signal S1 through not only the automatic synchronization signal S9 but also the resynchronization signal S3. The way in which the control system 4 generates and uses the resynchronization signal S3 may be the same as the control system 1.

Figure 6:
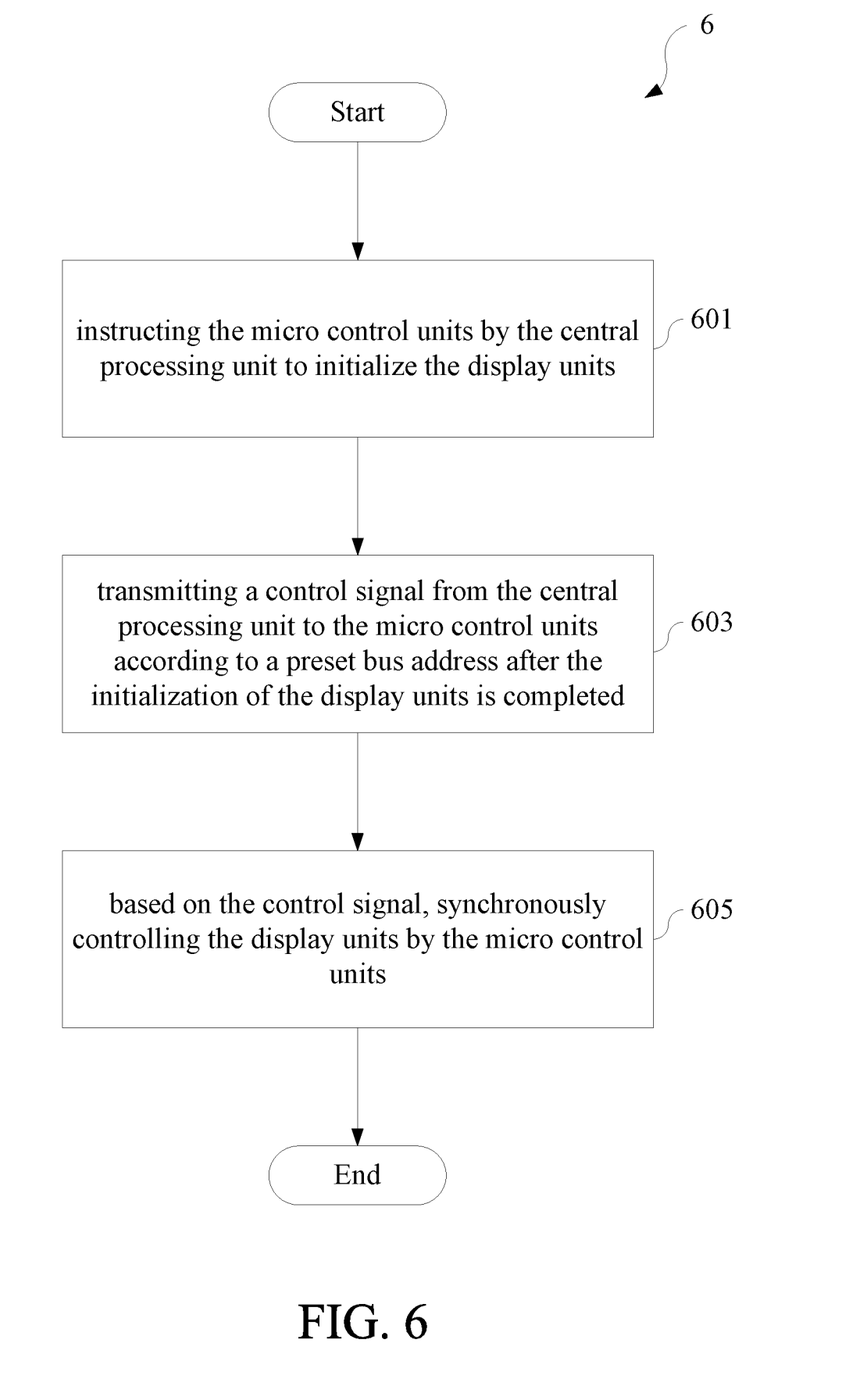
FIG. 6 illustrates a control method for controlling memory modules by way of example according to one or more embodiments of the present invention.

FIG. 6 illustrates a control method for controlling memory modules by way of example according to one or more embodiments of the present invention. However, what is shown in FIG. 6 is only intended to illustrate the embodiments of the present invention but not to limit the present invention.

FIG. 6 illustrates a control method 6 for controlling memory modules. Each of the memory modules may comprise a memory unit, a display unit and a micro control unit configured to control the display unit. The micro control units may be connected to a central processing unit through a bus. The control method 6 may comprise the following steps: instructing the micro control units by the central processing unit to initialize the display units (Step 601); transmitting a control signal from the central processing unit to the micro control units according to a preset bus address after the initialization of the display units is completed, wherein each of the micro control units comprises a bus address that is the same as the preset bus address (Step 603); and based on the control signal, synchronously controlling the display units by the micro control units (Step 605).

In some embodiments, the control method 6 may further comprise the following conditions: the central processing unit transmitting an initialization signal to the micro control units according to the preset bus address, and the micro control units synchronously initializing the display units based on the initialization signal.

In some embodiments, in addition to Steps 601-605, the control method 6 may further comprise the following step: controlling the display units by the micro control units according to respective default values before the central processing unit instructs the micro control units to initialize the display units.

In some embodiments, in addition to Steps 601-605, the control method 6 may further comprise the following steps: transmitting a display unit reset signal from the central processing unit to the micro control units according to the preset bus address while the micro control units control the display units based on the control signal; and based on the display unit reset signal, synchronously restarting the control of the display units according to the respective default values by the micro control units.

In some embodiments, in addition to Steps 601-605, the control method 6 may further comprise the following steps: transmitting a display unit reset signal from the central processing unit to the micro control units according to the preset bus address after the initialization of the display units is completed and before the central processing unit transmits the control signal to the micro control units; and based on the display unit reset signal, synchronously restarting the control of the display units according to the respective default values by the micro control units.

In some embodiments, aside from Steps 601-605, the control method 6 may further comprise the following steps: transmitting a resynchronization signal from the central processing unit to the micro control units according to the preset bus address during the micro control units controlling the display units based on the control signal; and based on the resynchronization signal, synchronously restarting the control of the display units based on the control signal by the micro control units.

In some embodiments, each of the memory modules may further comprise a transceiver. Also, in addition to Steps 601-605, the control method 6 may further comprise the following steps: restarting the control of the display units of the memory module based on the control signal and producing an automatic synchronization signal by the micro control unit of one of the memory modules while the micro control units are controlling the display units based on the control signal; and transmitting the automatic synchronization signal to the other micro control units via the transceivers of the memory modules to instruct the other micro control units to restart the control of the other display units based on the control signal while the micro control units are controlling the display units based on the control signal.

In some embodiments, in addition to Steps 601-605, the control method 6 may further comprise the following step: transmitting a micro control unit reset signal from the central processing unit to the micro control units according to the preset bus address to synchronously reset the micro control units while the micro control units are controlling the display units based on the control signal.

In some embodiments, the control method 6 may further comprise the following condition: the bus is a system management bus.

In some embodiments, the control method 6 may be implemented in the control system 1 or the control system 4, and may complete all the operations of the control system 1 or the control system 4 as described in the above embodiments. Because a person having ordinary skill in the art can clearly appreciated how the control method 6 is implemented in the control system 1 or the control system 4 according to the above description, the details will not be further described herein.

As described above, in the embodiments of the present invention, each of the micro control units may comprise a bus address that is the same as the preset bus address so that the central processing unit may synchronously transmit signals/commands to all of the micro control units, and thus, the micro control units are able to synchronously control the display units. In other words, in the embodiments of the present invention, the display units can work synchronously. Furthermore, in the embodiments of the present invention, it may always take the same time to instruct all micro control units to control the display units regardless of the number of the memory modules. Accordingly, the embodiments of the present invention can achieve the aforesaid objective.

The above disclosure provides the detailed technical contents and inventive features thereof for some embodiments of the present invention, but such disclosure is not to limit the present invention. A person having ordinary skill in the art may proceed with a variety of modifications and replacements based on the disclosures and suggestions of the present invention as described above without departing from the characteristics thereof. Nevertheless, although such modifications and replacements are not fully disclosed in the above descriptions, they have substantially been covered in the following claims as appended.

What is claimed is:

1. A control system for controlling memory modules, comprising:
   a plurality of memory modules, each of the memory modules comprising a memory unit, a display unit and a micro control unit configured to control the display unit; and
   a central processing unit connected to the micro control units through a bus, being configured to instruct the micro control units to initialize the display units, and configured to transmit a control signal to the micro control units according to a preset bus address to instruct the micro control units to synchronously control the display units after the initialization of the display units is completed;
   wherein each of the micro control units comprises a bus address that is the same as the preset bus address; and
   wherein the central processing unit is configured to further transmit a resynchronization signal to the micro control units according to the preset bus address to instruct the micro control units to synchronously restart the control of the display units based on the control signal while the micro control units are controlling the display units based on the control signal.

2. The control system according to claim 1, wherein the central processing unit is configured to further transmit an initialization signal to the micro control units according to the preset bus address to instruct the micro control units to synchronously initialize the display units.

3. The control system according to claim 1, wherein the micro control units are configured to further control the display units according to respective default values before the central processing unit instructs the micro control units to initialize the display units.

4. The control system according to claim 3, wherein the central processing unit is configured to further transmit a display unit reset signal to the micro control units according to the preset bus address to instruct the micro control units to synchronously restart the control of the display units according to the respective default values while the micro control units are controlling the display units based on the control signal.

5. The control system according to claim 3, wherein the central processing unit is configured further to transmit a display unit reset signal to the micro control units according to the preset bus address to instruct the micro control units to synchronously restart the control of the display units according to the respective default values after the initialization of the display units is completed and before the central processing unit transmits the control signal to the micro control units.

6. The control system according to claim 1, wherein:
   each of the memory modules further comprises a transceiver;
   the micro control unit of one of the memory modules restart the control of the display unit of the memory module based on the control signal and produces an automatic synchronization signal while the micro control units are controlling the display units based on the control signal; and
   the automatic synchronization signal is transmitted to the other micro control units via the transceivers of the memory modules to instruct the other micro control units to restart the control of the other display units based on the control signal while the micro control units are controlling the display units based on the control signal.

7. The control system according to claim 1, wherein the central processing unit is configured to further transmit a micro control unit reset signal to the micro control units according to the preset bus address to synchronously reset the micro control units while the micro control units are controlling the display units based on the control signal.

8. The control system according to claim 1, wherein the bus is a system management bus.

9. A control method for controlling a plurality of memory modules, each of the memory modules comprising a memory unit, a display unit and a micro control unit configured to control the display unit, the micro control units being connected to a central processing unit through a bus, and the control method comprising:
  instructing the micro control units by the central processing unit to initialize the display units;
  transmitting a control signal from the central processing unit to the micro control units according to a preset bus address after the initialization of the display units is completed;
  based on the control signal, synchronously controlling the display units by the micro control units;
  transmitting a resynchronization signal from the central processing unit to the micro control units according to the preset bus address while the micro control units are controlling the display units based on the control signal; and
  based on the resynchronization signal, synchronously restarting controlling of the display units based on the control signal by the micro control units;
  wherein each of the micro control units comprises a bus address that is the same as the preset bus address.

10. The control method according to claim 9, wherein the central processing unit transmits an initialization signal to the micro control units according to the preset bus address, and the micro control units synchronously initialize the display units based on the initialization signal.

11. The control method according to claim 9, further comprising:
  controlling the display units by the micro control units according to respective default values before the central processing unit instructs the micro control units to initialize the display units.

12. The control method according to claim 11, further comprising:
  transmitting a display unit reset signal from the central processing unit to the micro control units according to the preset bus address while the micro control units are controlling the display units based on the control signal; and
  based on the display unit reset signal, synchronously restarting controlling of the display units according to the respective default values by the micro control units.

13. The control method according to claim 11, further comprising:
  transmitting a display unit reset signal from the central processing unit to the micro control units according to the preset bus address after the initialization of the display units is completed and before the central processing unit transmits the control signal to the micro control units; and
  based on the display unit reset signal, synchronously restarting controlling of the display units according to the respective default values by the micro control units.

14. The control method according to claim 9, wherein each of the memory modules further comprises a transceiver, and the control method further comprises:
  restarting controlling of the display units of the memory module based on the control signal and producing an automatic synchronization signal by the micro control unit of one of the memory modules while the micro control units are controlling the display units based on the control signal; and
  transmitting the automatic synchronization signal to the other micro control units via the transceivers of the memory modules to instruct the other micro control units to restart the control of the other display units based on the control signal while the micro control units are controlling the display units based on the control signal.

15. The control method according to claim 9, further comprising:
  transmitting a micro control unit reset signal from the central processing unit to the micro control units according to the preset bus address to synchronously reset the micro control units while the micro control units are controlling the display units based on the control signal.

16. The control method according to claim 9, wherein the bus is a system management bus.

* * * * *